(12) United States Patent
Huber et al.

(10) Patent No.: US 8,379,469 B2
(45) Date of Patent: Feb. 19, 2013

(54) INTEGRATED CIRCUIT MEMORY OPERATION APPARATUS AND METHODS

(75) Inventors: Brian W. Huber, Allen, TX (US); Jason M. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/361,630

(22) Filed: Jan. 30, 2012

(65) Prior Publication Data
US 2012/0127808 A1    May 24, 2012

Related U.S. Application Data

(63) Continuation of application No. 12/491,899, filed on Jun. 25, 2009, now Pat. No. 8,107,305.

(51) Int. Cl.
*G11C 7/00* (2006.01)
(52) U.S. Cl. ............... 365/203; 365/191; 365/189.01
(58) Field of Classification Search ............... 365/203, 365/191, 185.25, 185.22, 230.06, 185.03, 365/207, 189.01, 185.23
See application file for complete search history.

(56) References Cited

U.S. PATENT DOCUMENTS

| | | | | |
|---|---|---|---|---|
| 5,818,770 A | | 10/1998 | Kim et al. | |
| 5,828,611 A | * | 10/1998 | Kaneko et al. | 365/203 |
| 5,982,688 A | * | 11/1999 | Han | 365/203 |
| 6,046,924 A | * | 4/2000 | Isobe et al. | 365/51 |
| 7,054,201 B2 | * | 5/2006 | Ahn et al. | 365/185.28 |
| 7,489,576 B2 | * | 2/2009 | Hirota et al. | 365/208 |
| 7,956,677 B2 | * | 6/2011 | Igarashi et al. | 327/544 |
| 8,107,305 B2 | | 1/2012 | Huber et al. | |
| 2002/0057622 A1 | * | 5/2002 | Sim | 365/230.03 |
| 2005/0063236 A1 | * | 3/2005 | Pagliato et al. | 365/222 |
| 2007/0070746 A1 | | 3/2007 | Han | |
| 2008/0002500 A1 | | 1/2008 | Kim | |
| 2010/0124134 A1 | | 5/2010 | Matsumoto et al. | |
| 2010/0329046 A1 | | 12/2010 | Huber et al. | |

OTHER PUBLICATIONS

Ooishi, T., et al., "A well-synchronized sensing/equalizing method for sub-1.0-V operating advanced DRAMs", IEEE Journal of Solid-State Circuits, 29(4), (Apr. 1994), 81-82.

* cited by examiner

*Primary Examiner* — Dang Nguyen
(74) *Attorney, Agent, or Firm* — Schwegman, Lundberg & Woessner, P.A.

(57) ABSTRACT

Some embodiments include apparatus and methods having a memory cell included in a device, a control line configured to receive a control signal to access the memory cell, and a first line configured to transfer information to and from the memory cell. The control signal has a first level during a first time interval and a second level during a second time interval of a memory operation. The apparatus and methods also include a module configured to reduce difference between a value of a voltage on the second line and a value of a voltage on a node of the device during a first time portion of the second time interval. Additional apparatus and methods are disclosed.

20 Claims, 12 Drawing Sheets

INTEGRATED CIRCUIT MEMORY OPERATION APPARATUS AND METHODS

PRIORITY APPLICATION

This application is a continuation of U.S. application Ser. No. 12/491,899, filed Jun. 25, 2009 now U.S. Pat. No. 8,107,305, which is incorporated herein by reference in its entirety.

BACKGROUND

Many integrated circuit (IC) devices, including memory devices, store data and other information in memory cells. These IC devices transfer information to and from the memory cells through conductive lines associated with the memory cells. A conventional memory IC device has a write operation to put information into the memory cells and a read operation to retrieve information from the memory cells. The device may operate to measure voltage levels on the conductive lines during these memory operations to determine the value of information to be put into or retrieved from the memory cells, with specific timing specification that should be used for various functions during read and write operations. However, some applications may not provide sufficient time to perform some of these functions, and thus, accurately measuring or sensing voltage levels on the conductive lines during memory read and write operations may pose a challenge.

DETAILED DESCRIPTION

Figure 1:
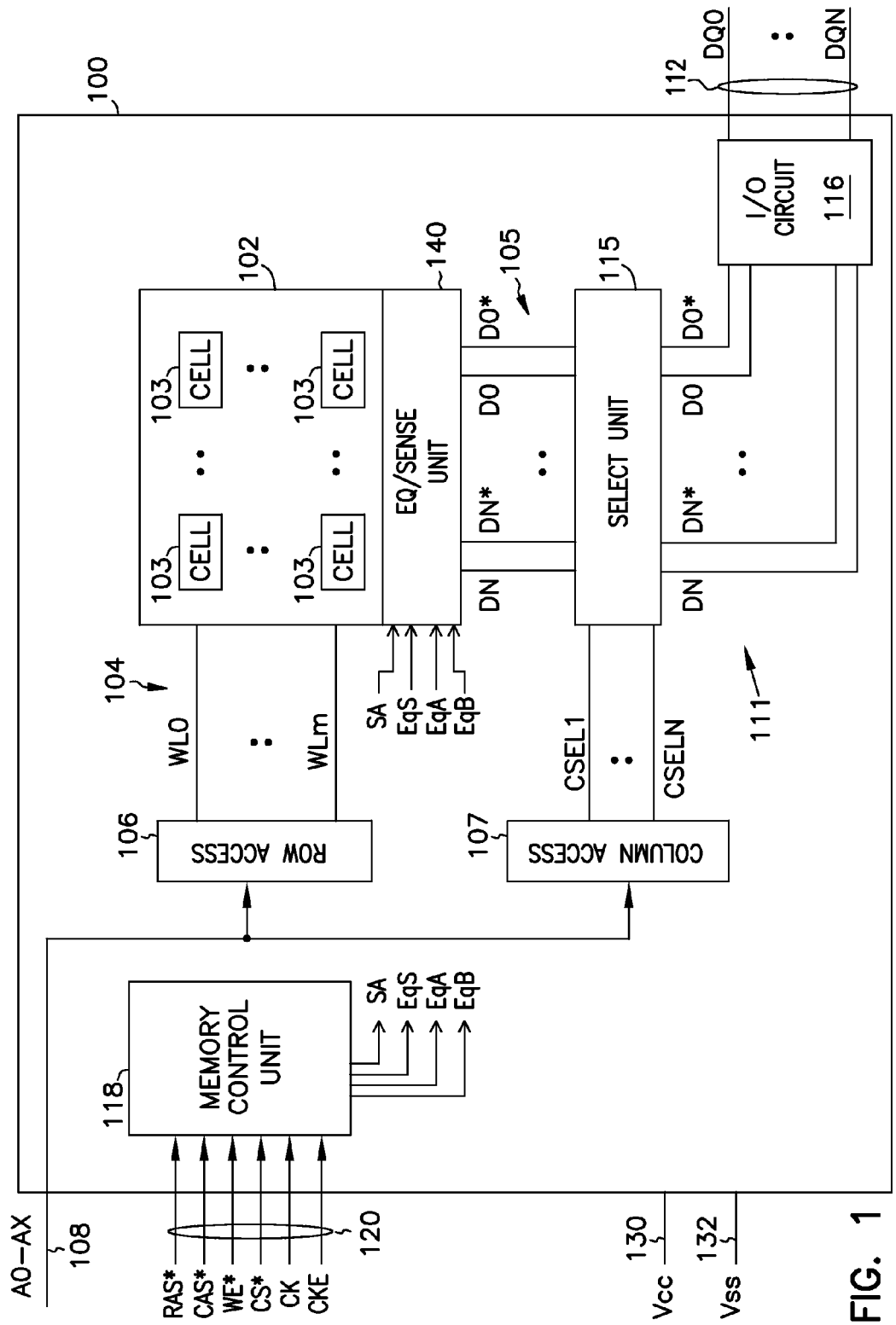
FIG. 1 shows a block diagram of an IC device including a unit to equilibrate and sense signals during a memory operation according to an embodiment of the invention.

FIG. 1 shows a block diagram of an IC device 100 including a unit 140 to equilibrate and sense signals during a memory operation according to an embodiment of the invention. IC device 100 may comprise a memory device, a processor, or other IC devices. As shown in FIG. 1, IC device 100 includes a memory array 102 having memory cells 103 arranged in rows and columns along with lines 104 (having signals WL0 through WLm) and lines 105 (having signals DL0, DL0*, ..., DLN, and DLN*). Lines 104 and lines 105 may comprise word lines and digit lines, respectively, of a device, such as a memory device. IC device 100 uses lines 104 to access memory cells 103 and lines 105 to transfer information (e.g., data) to and from memory cells 103. Row and column access circuits 106 and 107 decode address signals A0 through AX on lines 108 (e.g., address lines) to determine which memory cells 103 are to be selected and accessed during a memory operation of IC device 100.

Unit 140 performs an equilibrating (EQ) function and a sensing (SENSE) function lines on 105 to determine the value of information read from or written to memory cells 103. The equilibrating and sensing functions of IC device 100 can be similar to, or identical to, the equilibrating and sensing functions described in more detail with reference to FIG. 2 through FIG. 20.

As shown in FIG. 1, IC device 100 also includes circuitry 111 to transfer information between memory array 102 and lines 112 (e.g., data lines). Signals DQ0 through DQN represent information carried on lines 112.

IC device 100 can perform memory operations such as a read operation to read information from memory cells 103 and a write operation to write information into memory cells 103. In a read operation, the value of the information provided to lines 112 (e.g., logic 0 or logic 1) is based on the values of signals D0 and D0* through DN and DN* on lines 105. In a write operation, the value of the information provided to lines 105 is based on the values of signals DQ0 through DQN on lines 112.

A memory control unit 118 controls the memory operations, e.g., read and write operations, based on control signals on lines 120. Examples of signals include a row access strobe signal RAS*, a column access strobe signal CAS*, a write enable signal WE*, a chip select signal CS*, a clock signal CK, and a clock enable signal CKE. During various memory operations, memory control unit 118 generate signals, such as SA, EqS, EqA, and EqB, whose functions can be similar to, or identical to, the same signals described in more detail below with reference to FIG. 2 and FIG. 20.

IC device 100 of FIG. 1 receives voltages Vcc and Vss on lines 130 and 132, respectively. Voltage Vss can be a ground potential (having a value of approximately zero volts). Voltage Vcc can be an external voltage supplied to IC device 100 from an external power source such as a battery or an alternating current to direct current (AC-DC) converter circuitry.

As shown in FIG. 1, lines 105 include line pairs, such as a line pair associated with signals DL0 and DL0* and a line pair associated with signals DLN and DLN*. A person of ordinary skill in the art will readily recognize that two signals may be used to represent a bit of information that is read from or written into a memory cell of a memory device, e.g., a memory cell 103 of FIG. 1. The two signals may have different values (e.g., complementary values), one of which may correspond to the true value of the information, the other one may correspond to a complementary value of the information. For example, in a read operation of IC device 100, the DL0 and DL0* may present true and complementary values of the information read from one memory cell 103, and the DLN and DLN* signals may present true and complementary values of the information read from another memory cell 103. In this example, the signal DQ0 on lines 112 may correspond to the true value of the information read from a memory cell 103 and presented by the DL0 and DL0* signals, the signal DQN on lines 112 may correspond to the true value of the information read from a different memory cell 103 and presented by the DLN and DLN* signals.

As shown in FIG. 1, circuitry 111 includes a select circuit 115, which responds to select signals CSEL0 through CSELN to select the DL0, DL0*, DLN, and DLN* signals that represent the values of information transferred to or from memory cells 103. Column access circuit 107 can selectively activate the CSEL0 through CSELN signals based on the address signals A0 through AX. Select circuit 115 selects the DL0, DL0*, DLN, and DLN* signals and then provide them to an input/output (I/O) circuit 116. I/O circuit 116 may include one or more amplifying stages to receive the DL0, DL0*, DLN, and DLN* signals and then transfer them to lines 112 as the DQ0 and DQN signals.

Thus, IC device 100 can transfer the DL0, DL0*, DLN, and DLN* signals that represent the values of information read from memory cells 103 to lines 112 as the DQ0 signal and DQN signals. For clarity, FIG. 1 shows an example of two pairs of signals (e.g., DQ0/DL0* pair and DLN/DLN* pair) on lines 105 and two signals (e.g., DQ0 and DQN) on lines 112. IC device 100, however, has many other signals on lines 105 (e.g., signals similar to DL0, DL0*, . . . , DLN, and DLN*) and many other signals on lines 112 (e.g., signals similar to DQ0, . . . , DQN).

IC device 100 may include a dynamic random access memory (DRAM) device, a static random access memory (SRAM) device, a FLASH RAM device, other memory devices, or a combination of these memory devices. IC device 100 may include other components, which are not shown to help focus on the embodiments described herein. IC device 100 can be configured to include at least a portion of the memory device with associated structure or function, or both structure and function described below with reference to FIG. 2 through FIG. 20.

Figure 2:
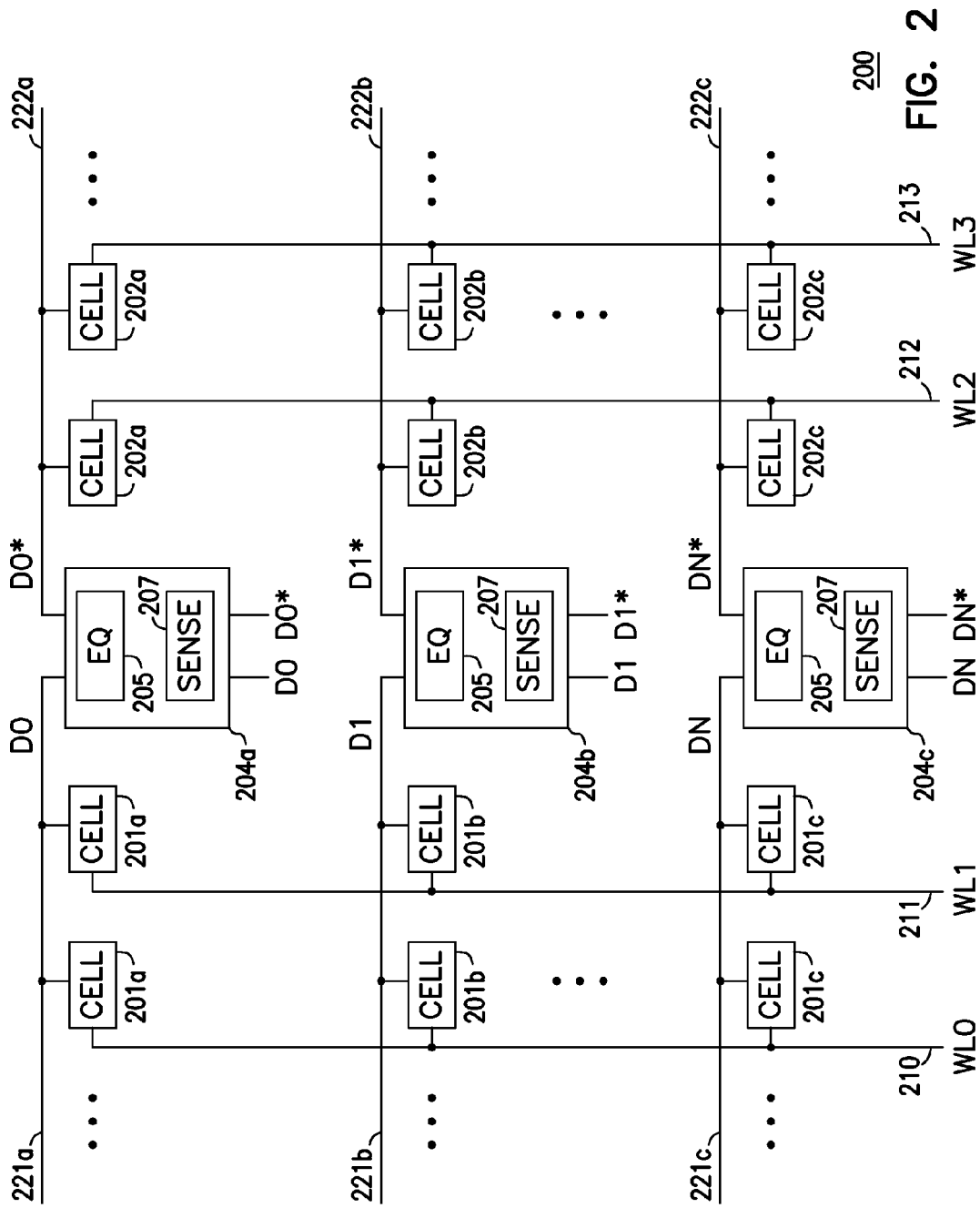
FIG. 2 shows a partial diagram of an IC device having memory cells and associated lines, according to an embodiment of the invention.

FIG. 2 shows a partial diagram of an IC device 200 having memory cells 201*a*, 201*b*, 201*c*, 202*a*, 202*b*, and 202*c* (collectively called "the memory cells"), according to an embodiment of the invention. IC device 200 includes additional features similar to, or identical to, those shown in FIG. 1. However, to more readily focus on the features described below, FIG. 2 omits illustrating these additional features of IC device 200.

IC device 200 includes lines 210, 211, 212, and 213 to receive signals WL0, WL1, WL2, and WL3 to access the memory cells, and lines 221*a*, 221*b*, 221*c*, 222*a*, 222*b*, and 222*c* to transfer information to and from the memory cells. The information is represented by signals D0, D0*, D1, D1*, and DN, DN*.

Lines 210, 211, 212, and 213 and associated signals WL0, WL1, WL2, and WL3 can correspond to a group of lines 104 and a group of associated signals WL0 through WLm of FIG. 1. Lines 221*a*, 221*b*, 221*c*, 222*a*, 222*b*, and 222*c* and associated signals D0, D0*, D1, D1* through DN, DN* can correspond to a group of lines 105 and a group of associated signals D0, D0*, D1, D1*, through DN, DN* of FIG. 1. FIG. 2 shows an example arrangement of the memory cells with the associated lines. The memory cells and lines in FIG. 2 can be arranged in other arrangements known to those skilled in the art.

IC device 200 also includes units 240*a*, 240*b*, and 240*c*, each of which includes a circuit (EQ) 205 and a circuit (SENSE) 207 for equilibrating and sensing, respectively, signals on lines 221*a*, 221*b*, 221*c*, 222*a*, 222*b*, and 222*c* during read and write operations of IC device 200 to determine the value of information transferred to and from the memory cells. Equilibrating and sensing are described in more detail below with reference to FIG. 3 through FIG. 20. The structure, function, and operation of units 240*a*, 240*b*, and 240*c* of FIG. 2 are similar to those of the unit shown in FIG. 3. To more readily focus on the embodiments described herein, FIG. 3 through FIG. 20 show only a portion of an IC device.

Figure 3:
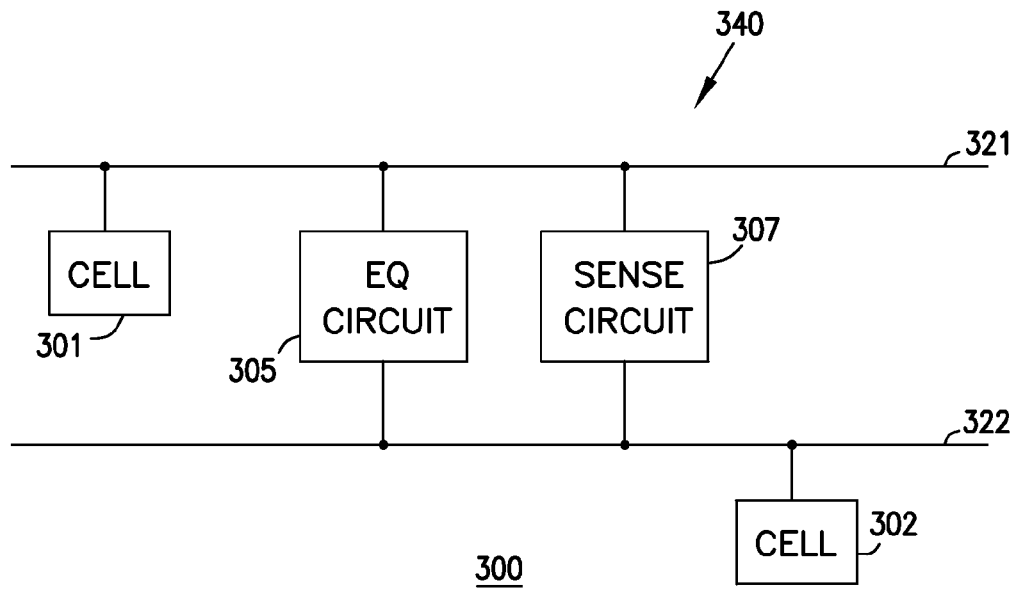
FIG. 3 shows a partial diagram of an IC device including a unit to equilibrate and sense signals, according to an embodiment of the invention.

FIG. 3 shows a partial diagram of an IC device 300 including a unit 340 with circuits 305 and 307 to equilibrate and sense signals on lines 321 and 322 associated with memory cells 301 and 302, according to an embodiment of the invention. Unit 340 can be substituted for each of units 240*a*, 240*b*, and 240*c* of FIG. 2. Thus, the combination of signals D and D* and lines 321 and 322 in FIG. 3 can correspond to the combination of signals D0 and D0* and lines 221*a* and 222*a*, the combination of signals D1 and D1* and lines 221*b* and 222*b*, or the combination of signals DN and DN* and lines 221*c* and 222*c*, of FIG. 2.

Figure 4:
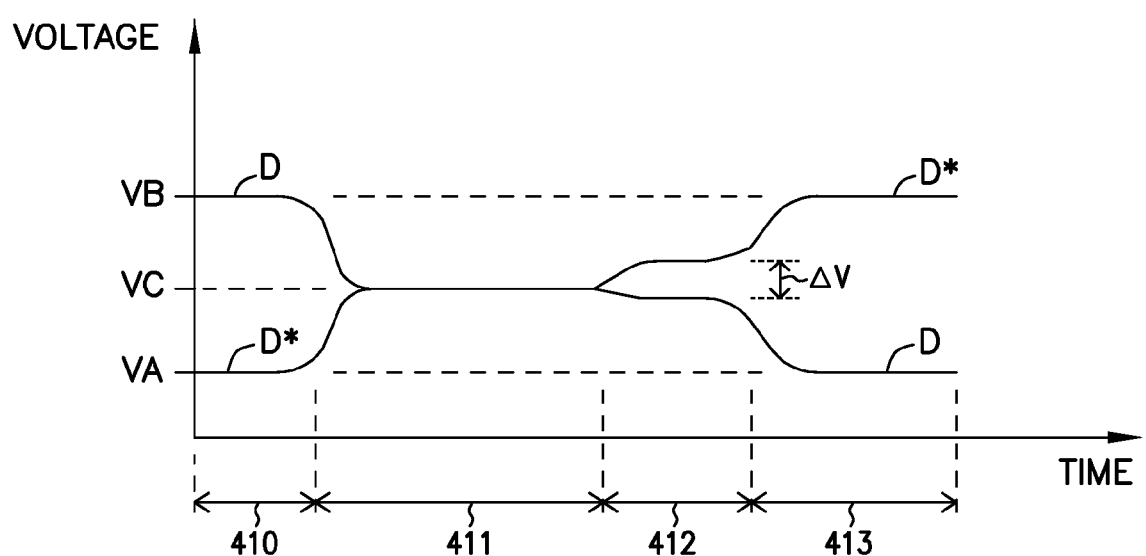
FIG. 4 shows an example timing diagram during a memory operation of the IC device of FIG. 3, according to an embodiment of the invention.

FIG. 4 shows an example timing diagram during a memory operation of IC device 300 of FIG. 3, according to an embodiment of the invention. FIG. 4 shows waveforms of signals D and D* during time intervals 410, 411, 412, and 413.

During time interval 410, signals D and D* can have values VA and VB, respectively, which correspond to the values of voltages on respective lines 321 and 322 of FIG. 3. Time interval 410 can occur before memory cell 301 or 302 is accessed. Memory cell 301 or 302 can be selected and then accessed when IC device 300 of FIG. 3 writes information to or reads information from the selected memory cell.

During time interval 411, circuit 305 of FIG. 3 equilibrates signals D and D*, such that these two signals can converge to the same (or substantially the same) voltage value, such as value VC. In this description, to "equilibrate", "equilibrating", or "equilibration" refers to a process of reducing a difference in values (e.g., voltage values) between two signals (e.g., D and D*) on two different lines such that the two signals can converge to the same (or substantially the same) value. Reducing a difference in values between two signals on two different lines may include sharing charge between the lines by, for example, electrically coupling the two lines together.

In a read operation, information can be transferred to one of lines 321 and 322 of FIG. 3 from the accessed selected memory cell after signals D and D* are equilibrated. For example, the selected memory cell can be accessed during time interval 412. FIG. 4 shows a delta V (ΔV) between signals D and D* during time interval 412 to indicate a difference in values between the voltages on lines 321 and 322 when information transferred to one of lines 321 and 322 from the accessed memory cell. Circuit 307 of FIG. 3 can act as an amplifier to sense signals D and D* and to amplify ΔV to determine the value of information stored in the selected memory.

During time interval 413, circuit 307 senses signals D and D* causes signals D and D* to go to opposite directions. For example, if the value of the voltage on line 322 (signal D*) is greater than the value of the voltage on line 321, as shown in FIG. 4 during time interval 412, then signal D* goes to value VB and signal D goes to value VA via amplification performed by circuit 307. In the opposite situation (not shown in FIG. 4) if the value of the voltage on line 322 (signal D*) is less than the value of the voltage on line 321, then signal D* goes to value VA and signal D goes to value VB. The voltage values of D and D* during time interval 412 are based on the value of information stored in the selected memory cell. For example, if the selected memory cell stores information with a value that is less than VC (e.g., logic 0) and the selected memory cell is connected to line 321 (signal D), then signal D during time interval 412 is less than signal D*, as shown in FIG. 4. If the selected memory cell stores information with a value that is higher than VC (e.g., logic 1) and the selected memory cell is connected to line 321 (signal D), then signal D during time interval 412 would be greater than signal D*.

In the above-described read operation, additional circuitry (not shown, but can be similar to select circuit 115 and I/O circuit 116 of FIG. 1) of IC device 300 can provide output information (e.g., logic 1 or 0) based on the voltage values of signal D and D* during time interval 413. The output information can be transferred to other devices coupled to IC device 300.

In a write operation of IC device 300, the additional circuitry (not shown) of IC device 300 can provide a value (e.g., voltages representing logic 1 or 0) to lines 321 or 322 during time interval 413, so that the value can be written into the selected memory cell.

The above description relates to the operations of circuit 307 with respect to a read operation or a write operation. Circuit 307 can be a sense amplifier circuitry of a device, such as a memory device. After reading this description, one of ordinary skill in the art would readily recognize that, depending on the configuration the sense amplifier such as circuit 307, the waveforms of signals D and D* can be different from the example shown in FIG. 4.

In summary, circuit 305 of IC device 300 of FIG. 3 reduces the difference in values between voltages on lines 321 and 322, such that the values of the voltages on lines 321 and 322 can be equal or substantially equal during an equilibrating function. Circuit 307 senses signals D and D* on lines 321 and 322 to determine the value of information transferred to or from memory cells.

Figure 5:
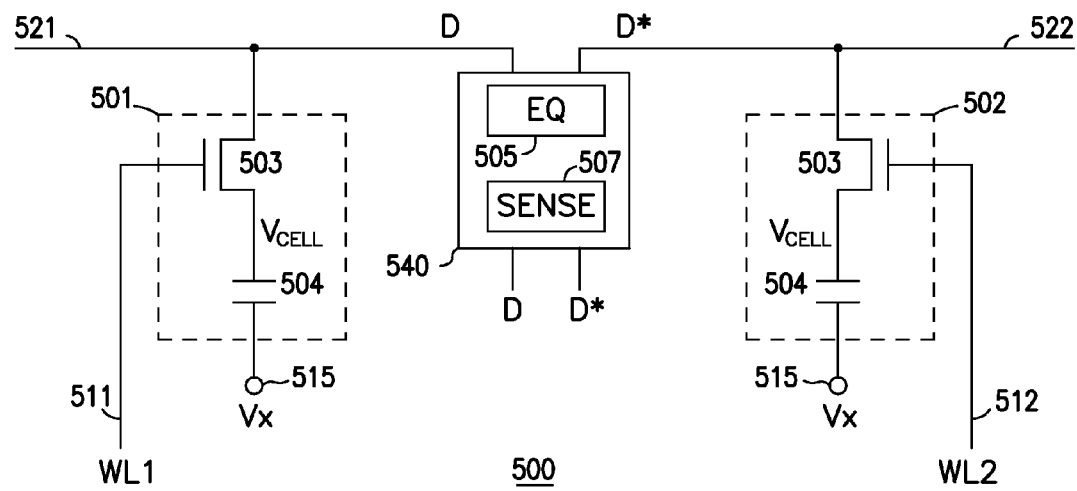
FIG. 5 shows a partial diagram of an IC device including memory cells with access components, according to an embodiment of the invention.

FIG. 5 shows a partial diagram of an IC device 500 including memory cells 501 and 502 with access components (e.g., transistors) 503, according to an embodiment of the invention. IC device 500 includes lines 511 and 512 to receive signals WL1 and WL2. Lines 511 and 512 and signals WL1 and WL2 can be called control lines and control signals, respectively. IC device 500 can selectively activate signals WL1 and WL2 to access memory cells 501 and 502 to transfer information to or from memory cells 501 and 502. IC device 500 includes lines 521 and 522 to transfer the information, which is represented by signals D and D*. IC device 500 also include a unit 540 having a equilibration circuit 505 and a sense amplifier 507 for equilibrating and sensing, respectively, signals D and D* on lines 521 and 522 during read and write operations of IC device 500 to determine the value of information transferred to and from the memory cells 501 and 502.

Unit 540 can correspond to unit 240a, 240b, or 240c of FIG. 2. The combination of signals D and D* and lines 521 and 522 of FIG. 5 can correspond to the combination of signals D0 and D0* and lines 221a and 222a, the combination of signals D1 and D1* and lines 221b and 222b, or the combination of signals DN and DN* and lines 221c and 222c of FIG. 2. The combination of signals WL1 and WL2 and lines 511 and 512 can correspond to the combination of signals WL1 and WL2 and lines 211 and 212 of FIG. 2.

Each of memory cells 501 and 502 includes a transistor 503 and a memory element 504 (which can be a capacitor, as shown in FIG. 5). One side of memory element 504 is coupled to a node 515 that has a voltage Vx; the other side of memory element 504 is coupled to transistor 503. Voltage Vx can have a value approximately equal to VC of FIG. 4. In FIG. 5, IC device 500 uses signals WL1 and WL2 to turn on transistors 503 to access memory cells 501 and 502 during a memory operation.

Voltage Vx can be set to various voltage values, but it can be set to approximately ½ $V_{SUPPLY}$ to reduce leakages of memory element 504. Voltage $V_{SUPPLY}$ is the supply voltage of IC device 500. $V_{SUPPLY}$ described herein can be an external voltage (e.g., similar to Vcc of FIG. 1) provided to the IC device or an internal voltage generated based on the external voltage. The IC device uses $V_{SUPPLY}$ to operate the device and/or set memory cell voltage levels. For example, IC device 500 can use $V_{SUPPLY}$ to set a cell voltage $V_{CELL}$ that corresponds to the value of information stored in memory cells 501 and 502.

Figure 6:
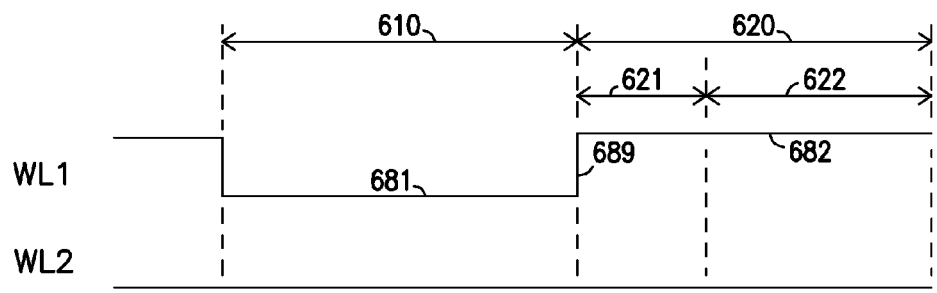
FIG. 6 shows an example timing diagram during a memory operation of the IC device of FIG. 5, according to an embodiment of the invention.

FIG. 6 shows an example timing diagram during a memory operation of IC device 500 of FIG. 5, according to an embodiment of the invention. FIG. 6 shows waveforms of signals WL1 and WL2 during time intervals 610 and 620. As shown in FIG. 6, time interval 620 can be divided into time portions 621 and 622. The following description assumes that memory cell 501 of FIG. 5 is selected in a memory operation to read information (e.g., in a read operation) from it, or to write information to it (e.g., in a write operation). Memory cell 502 of FIG. 5 is not selected in this memory operation when memory cell 501 is selected.

As shown in FIG. 6, signal WL1 can be activated such that it has a transition 689 between a level 681 during time interval 610 and a level 682 during time interval 620. Signal WL2 is not activated (e.g., it may be deactivated), such that it remains at the same level (e.g., zero volt or ground potential) during time intervals 610 and 620.

During a memory operation, IC device 500 equilibrates signals D and D* during time interval 610, then during time portion 621 of time interval 620 signal D will begin charge sharing with memory cell 501. The equilibration of signals D and D* on lines 521 and 522 of FIG. 5 can be similar to the equilibration of signals D and D* on lines 321 and 322, as described above with reference to FIG. 3 and FIG. 4. In FIG. 5 and FIG. 6, IC device 500 may sense signals D and D* on lines 521 and 522 during time portion 622 of time interval 620 after memory cell 501 is accessed.

During time interval 620, signal WL1 is activated to level 682. Transistor 503 of memory cell 501 of FIG. 5 is turned on and forms a conductive path between memory element 504 and line 521 of FIG. 5. Charge is shared between memory element 504 and line 521 through transistor 503 of memory cell 501, resulting in a change in the value of voltage on line 521.

Since signal WL2 is not activated, transistor 503 of memory cell 502 of FIG. 5 is not turned on (turned off or remains turned off). Thus, no charge is shared between memory element 504 of memory cell 502 (unselected memory cell). Therefore, the value of voltage on line 522 remains unchanged or may change slightly due to parasitic coupling between line 522 and surrounding circuit components. Nevertheless, when transistor 503 of memory cell 501 is turned on while transistor 503 of memory cell 502 is turned off, a difference in values between voltages on lines 521 and 522 is developed. This value difference is similar to ΔV of FIG. 4.

During time portion 622 of time interval 620, IC device 500 sense signals D and D* to amplify ΔV. Then, additional circuitry (not show but can be similar to select circuit 115 and I/O circuit 116 of FIG. 1) of IC device 500 can provide output information based on the sensing function.

Figure 7:
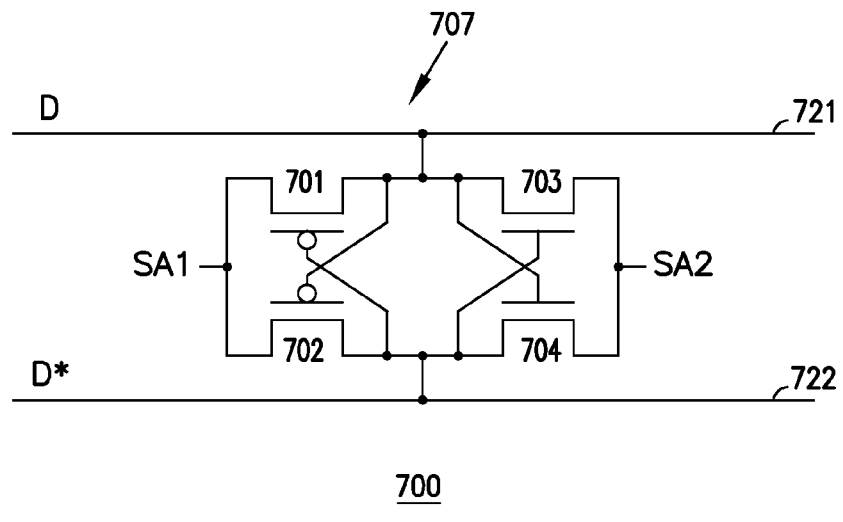
FIG. 7 shows a partial diagram of an IC device including a circuit to sense signals during a memory operation, according to an embodiment of the invention.

FIG. 7 shows a partial diagram of an IC device 700 including a circuit 707 to sense signals D and D* on lines 721 and 722 during a memory operation, according to an embodiment of the invention. Circuit 707 can be substituted for circuit 307 of FIG. 3. Thus, the combination of signals D and D* and lines 721 and 722 of FIG. 7 can correspond to the combination of signals D and D* and lines 321 and 322 of FIG. 3.

In FIG. 7, circuit 707 includes transistors 701, 702, 703, and 704 coupled to lines 721 and 722 and operates as a sense amplifier. Transistors 701 and 702 are p-channel transistors, 703 and 704 are n-channel transistors. Circuit 707 receives signals SA1 and SA2.

Figure 8:
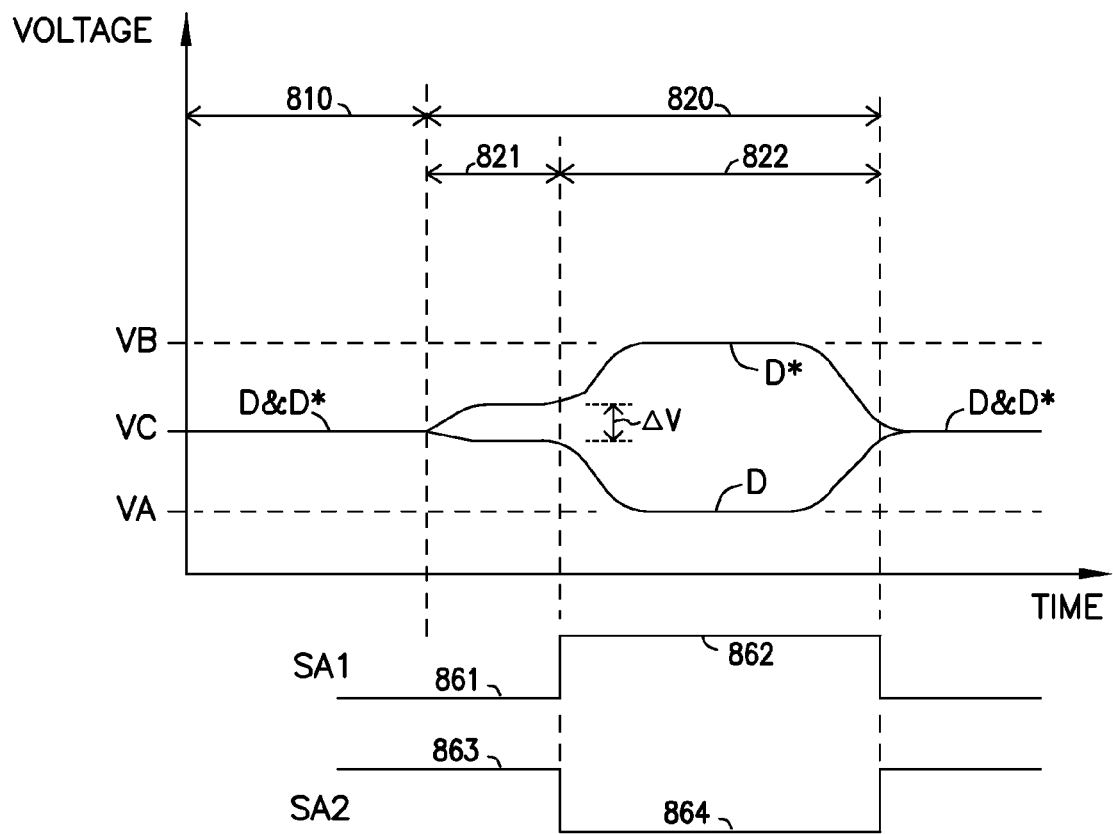
FIG. 8 shows an example timing diagram during the memory operation of the IC device of FIG. 7, according to an embodiment of the invention.

FIG. 8 shows an example timing diagram during a memory operation of IC device 700 of FIG. 7, according to an embodiment of the invention. FIG. 8 shows waveforms of signals SA1 and SA2 during time intervals 810 and 820. Signals SA1 can be switched between level 861 and 862 and signal SA2 can be switched between levels 863 and 864.

As shown in FIG. 8, time interval 820 can be divided into time portions 821 and 822. Voltage values VA, VB, and VC can be similar to voltage values VA, VB, and VC of FIG. 4. In FIG. 8, during time interval 810 of a memory operation, IC device 700 equilibrates signals D and D*. After signals D and D* are equilibrated, IC device 700 accesses a selected memory cell associated with line 721 or 722 of FIG. 7. A difference in voltage values (e.g. ΔV of FIG. 8) between signal D and D* develops when the selected memory cell is accessed and charge is shared between the accessed memory cell and one of lines 721 and 722. Circuit 707 of FIG. 7 responds to signals SA1 and SA2 and senses signals D and D* during time portion 822 and cause signals D and D* to go to values VA and VB. Then, additional circuitry (not show but can be similar to select circuit 115 and I/O circuit 116 of FIG. 1) of IC device 700 can provide output information based on the sensing function.

Figure 9:
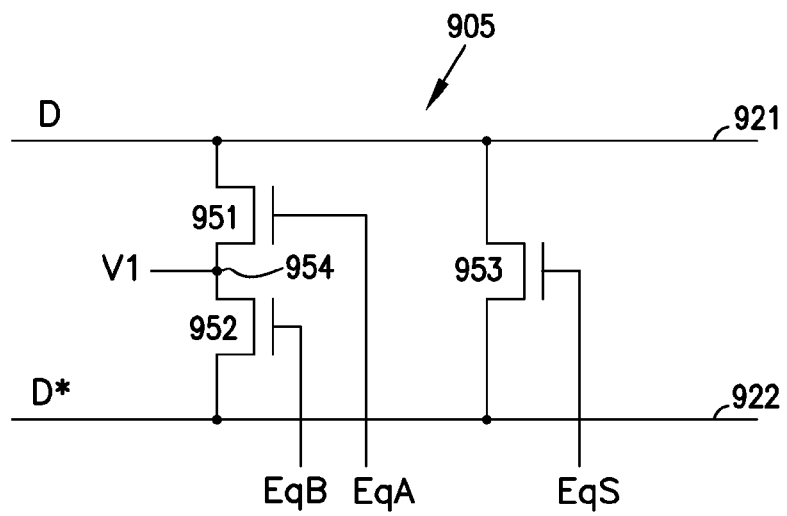
FIG. 9 shows a partial diagram of an IC device including a circuit for use in an equilibrating function during a memory operation of an IC device, according to an embodiment of the invention.

FIG. 9 shows a partial diagram of an IC device 900 including a circuit 905 for use in an equilibrating function during a memory operation of IC device 900, according to an embodiment of the invention. Circuit 905 can be substituted for circuit 305 of FIG. 3. Thus, the combination of signals D and D* and lines 921 and 922 can correspond to the combination of signals D and D* and lines 321 and 322 of FIG. 3.

As shown in FIG. 9, circuit 905 includes transistors 951, 952, and 953 having gates responsive to signal EqA, EqB, and EqS to equilibrate signals D and D* on lines 921 and 922 during a memory operation of IC device 900.

Figure 10:
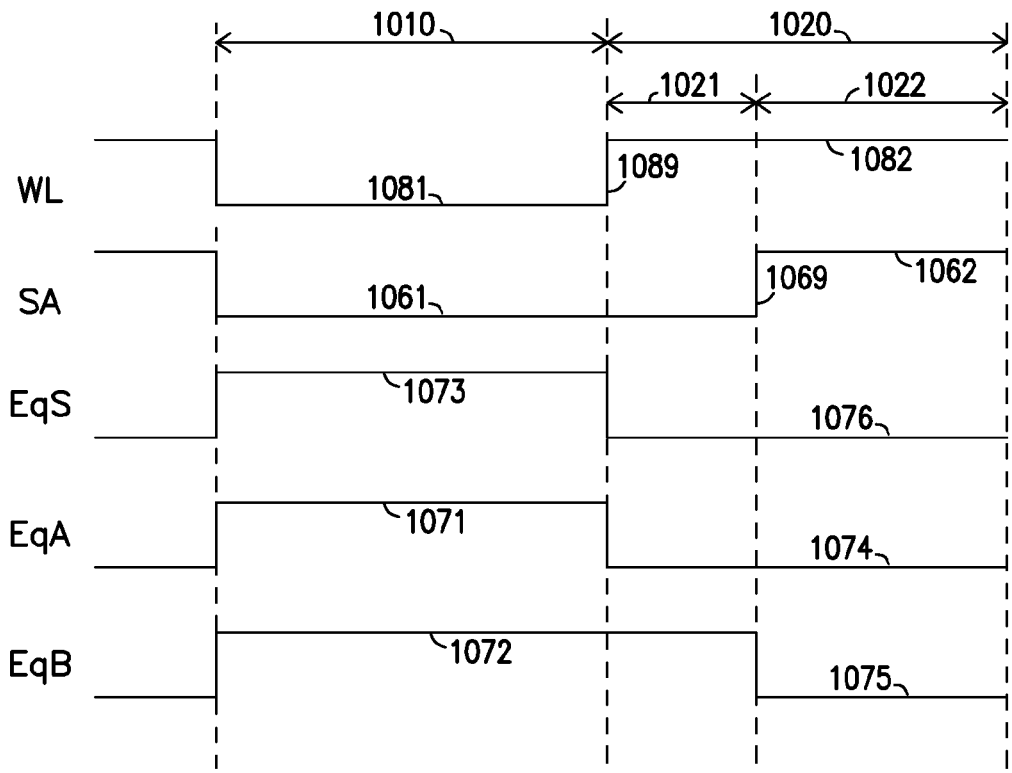
FIG. 10 shows an example timing diagram during the memory operation of the IC device of FIG. 9, according to an embodiment of the invention.

FIG. 10 shows an example timing diagram during a memory operation of IC device 900 of FIG. 9, according to an embodiment of the invention. FIG. 10 shows waveforms of signals EqA, EqB, and EqS of FIG. 9, and waveforms of signals WL and SA during time intervals 1010 and 1020 of a memory operation (e.g., read or write operation) of IC device 900. As shown in FIG. 10, time interval 1020 can be divided into time portions 1021 and 1022. Signal WL of FIG. 10 can be similar to signal WL1 or WL2 of FIG. 5. Signal SA of FIG. 10 can be similar to signal SA1 of FIG. 7 and FIG. 8.

IC device 900 of FIG. 9 includes memory cells (not shown) associated with lines 921 and 922. Those memory cells can be similar to memory cells 501 and 502 of FIG. 5. In FIG. 10, signal WL represents the signal associated with a selected memory cell of IC device 900. The selected memory can be similar to memory cell 501 or 502 of FIG. 5. Signal WL of FIG. 10 can correspond to signal WL1 of FIG. 5 if the selected memory cell of IC device 900 corresponds to memory cell 501 of FIG. 5. Signal WL of FIG. 10 can also correspond to signal WL2 of FIG. 5 if the selected memory cell of IC device 900 corresponds to memory cell 502 of FIG. 5. IC device 900 uses signal WL to access the selected memory cell during a memory operation, such as a read or write operation.

In the following description with reference to FIG. 9 through FIG. 10, line 921 is assumed to be associated with a selected memory cell (e.g., which can correspond to memory cell 901 of FIG. 5) during a memory operation. Line 922 is assumed to be associated with an unselected memory cell (which can correspond to memory cell 902 of FIG. 5) during the memory operation.

IC device 900 includes a sense circuit (not shown) that can be similar to circuit 307 of FIG. 3 or circuit 707 of FIG. 7. IC device 900 uses signal SA of FIG. 10 to enable the sense circuit of IC device 900 to sense signals D and D* on lines 921 and 922 during a memory operation to determine value of information transferred to or from the selected memory cell. The following description refers to both FIG. 9 and FIG. 10.

During a memory operation, IC device 900 activates signal WL, such that it has signal levels 1081 and 1082 and a transition 1089. IC device 900 accesses a selected memory cell associated during time portion 1021 and senses signals D and D* (e.g., using a sense circuit) during time portion 1022. Circuit 905 of IC device 900 equilibrates signals D and D* during time interval 1010 in response to signals EqA, EqB, and EqS.

As shown in time interval 1010 in FIG. 10, signals EqA, EqB, and EqS are activated to signal levels 1071, 1072, and 1073, respectively, to turn on transistors 951, 952 and 953. When transistors 951 and 952 are turned on, a conductive path is formed among circuit node 954 and lines 921 and 922 through transistors 951 and 952. The conductive path includes one conductive segment between node 954 and line 921 and another conductive segment between node 954 and line 922. Node 954 has a voltage V1. When the conductive path is formed between lines 921 and 922 and node 954, the values of the voltages on lines 921 and 922 begin to converge to a value of the voltage at node 954 (voltage V1) through transistors 951 and 952.

Another conductive path is also formed between lines 921 and 922 through transistor 953 when transistor 953 is turned on to further enable the voltages on lines 921 and 922 to converge to voltage V1. In some cases, however, transistor 953 can be omitted.

During time interval 1020, IC device 900 deactivate signals EqA and EqS, such that signals EqA and EqS switch to levels 1074 and 1076, respectively, to turn off transistors 951 and 953. When transistor 951 is turned off, the conductive segment between node 954 and line 921 is disabled, meaning that line 921 is electrically decoupled from node 954. When transistor 953 is turned off, the conductive path between lines 921 and 922, through transistor 953, is also disabled.

During time portion 1021, IC device 900 of FIG. 9 starts to access the selected memory cell associated with line 921 to transfer information between the selected memory cell and line 921.

Also during time portion 1021, IC device 900 of FIG. 9 keeps signal EqB unchanged at level 1072, thereby enabling transistor 952 to remain turned on. Thus, during time portion 1021, the conductive segment between line 922 and node 954 remains enabled (maintained), meaning that line 922 remains electrically coupled to node 954. Therefore, during time portion 1021, the value of the voltage on line 922 is further drawn toward the value of voltage V1 at node 954.

During time portion 1022, IC device 900 of FIG. 9 switches signal EqB to level 1075 to electrically decouple line 922 from node 954. Then, IC device 900 switches signal SA from level 1061 to level 1062 at transition 1069 to perform a sensing function to sense signals D and D* on lines 921 and 922 to determine value of information transferred to or from the selected memory cell.

In some alternative cases, signal EqB can be activated such that it has level 1072 only during time portion 1021 and has level 1075 during time interval 1010 and time portion 1022, so that transistor 952 is turned on only during time portion 1021. And EqA can be kept at level 1074 throughout time intervals 1010 and 1020. In the alternative cases, although conductive segments between node 954 and line 921 as well as between node 954 and line 922 are disabled (transistors 951 and 952 are turned off) during time portion 1010, a conductive segment between lines 922 and 921, through transistor 953, is enabled. Thus, in the alternative cases, circuit 905 still equilibrates the value of the voltages on lines 922 and 921 but toward a value of a natural voltage $V_N$ that is approximately halfway between the voltage levels on lines 921 and 922 (which can be similar to halfway between voltage levels VA and VB of FIG. 8). Then line 922 is further drawn towards V1 at node 954 during time portion 1021 which may or may not be similar to the value of natural voltage $V_N$.

In IC device 900 of FIG. 9, providing an extended or separate time interval (such as time portion 1021 in FIG. 10) for drawing the value of voltage on line 922 towards the value of voltage V1, improved memory operation of IC device 900 is experienced, as explained below.

As described above, before sensing of signals on lines 921 and 922, IC device 900 of FIG. 9 reduces the difference in values between voltages on lines 921 and 922, so that they can converge to the same intended voltage value, such as the value of voltage V1 at node 954. If voltage values on lines 921 and 922 are the same (or substantially the same), then the difference is zero (or substantially zero). However, the voltage value on one or both of lines 921 and 922 may not reach the intended value of voltage V1 at node 954 by the time (e.g., at transition 1089) signal WL switches from signal level 1081 to signal level 1082 to access the selected memory cell. Thus, the difference in values between the voltages on lines 921 and 922 may not be at zero or substantially zero at transition 1089. In IC 900 of FIG. 9, by keeping the conductive path between node 954 and line 922 enabled after time interval 1010 while the conductive path between node 954 and the line 921 is disabled, the voltage value on line 922 can further move toward the intended value of the voltage (e.g., V1) at node 954. This further decreases the effective difference in values between the voltages on lines 921 and 922 as observed just prior to transition 1089 to improve the equilibrating function.

It is considered effective difference because line 921 is moving to a new voltage level influenced by selected memory cell after transition 1089.

The value of voltage V1 at node 954 can be set to the value of natural voltage $V_N$. As described above, $V_N$ can be approximately ½ $V_{SUPPLY}$. Information stored in a memory cell of IC device 900 can have different values represented by different voltage (charge) values in the memory cell. For example, the information can have a value corresponding to logic 1 or 0. To store information with a logic 1, the memory cell can be configured to hold a voltage corresponding voltage $V_N$ plus a first offset value. To store information with a logic 0, the memory cell can be configured to hold a voltage corresponding voltage $V_N$ minus a second offset value. Each of first and second offset values can be between a few millivolts to a few hundred millivolts, or some other values. The first and second offset values can be symmetrical or non-symmetrical with respect to $V_N$ settings. Thus, the first and second offset values can be the same value or different values.

Charge leakage from the memory cell, in some cases, may cause the voltage (e.g., $V_{CELL}$ in FIG. 5) representing the value of information stored in the memory to change (e.g., decrease). $V_{CELL}$ can be set to $V_N$ plus a first offset value or $V_N$ minus a second offset value. Thus, to account for the potential change in value of the voltage in the memory cell, voltage V1 at node 954 can be set to voltage $V_N$ minus $V_{LEAK}$, where $V_{LEAK}$ is chosen to minimize the effect of the charge leakage as seen by sensing. Thus, in cases where a potential leakage to the memory cells may occur, V1 can be set to approximately $V_N$ minus $V_{LEAK}$.

Figure 11:
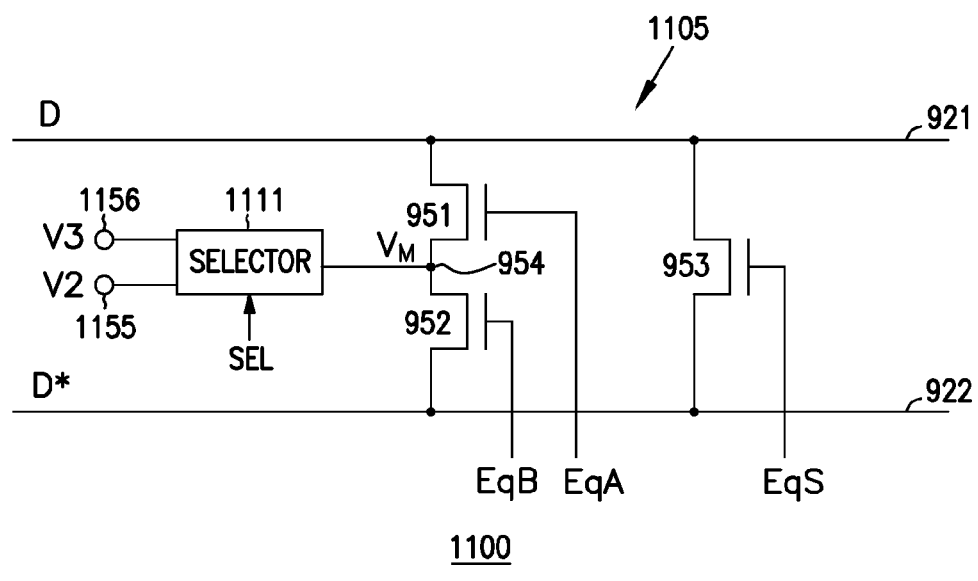
FIG. 11 shows a partial diagram of an IC device including a circuit having a selector for use in an equilibrating function during a memory operation of IC device, according to an embodiment of the invention.
Figure 12:
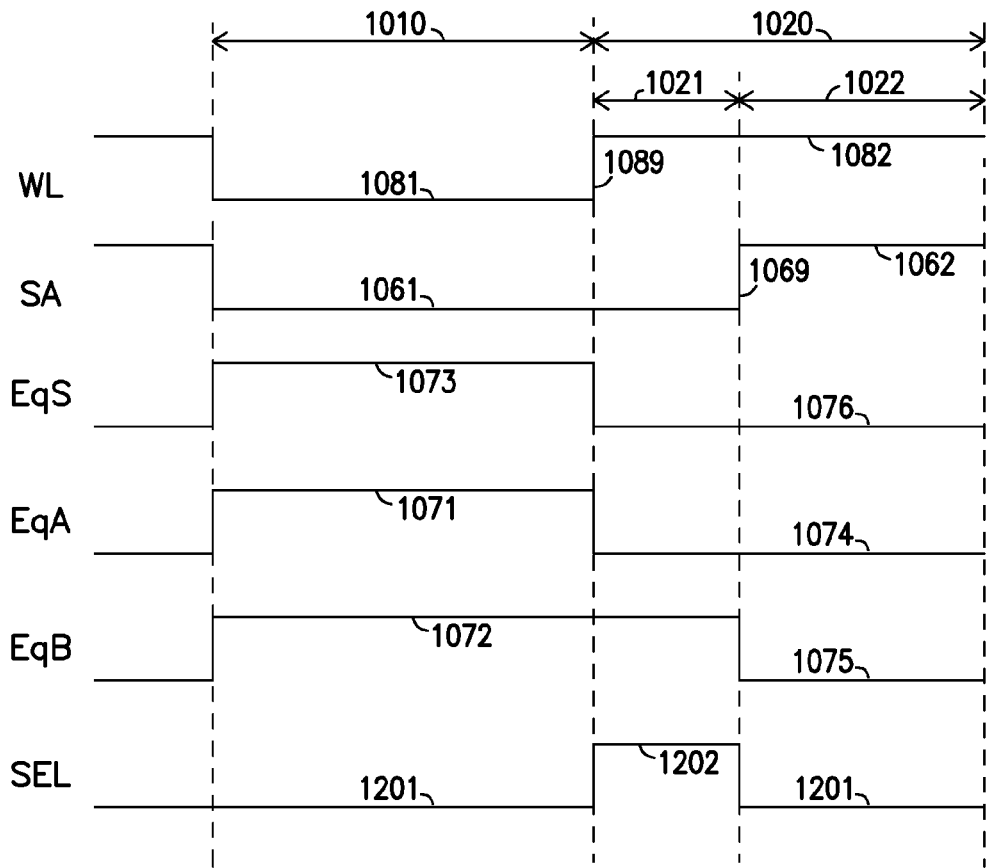
FIG. 12 shows an example timing diagram during the memory operation of the IC device of FIG. 11, according to an embodiment of the invention.

FIG. 11 shows a partial diagram of an IC device 1100 including a circuit 1105 having a selector 1111 for use in an equilibrating function during a memory operation of IC device 1100, according to an embodiment of the invention. FIG. 12 shows an example timing diagram during a memory operation of IC device 1100 of FIG. 11, according to an embodiment of the invention. Circuit 1105 of FIG. 11 and circuit 905 of FIG. 9 include similar features. FIG. 12 and FIG. 10 also show waveforms associated with the similar features. Thus, for simplicity, the similar features between FIG. 9 and FIG. 11 and between FIG. 10 and FIG. 12 are given the same reference designations, such as transistors 951, 952, and 953, lines 921 and 922, signals D, D*, EqA, EqB, and signals WL and SA. For simplicity, the operations of these similar features are not repeated in the description of FIG. 11 and FIG. 12.

Circuit 1105 comprises additional features that are not included in circuit 905. These additional features include selector 1111 and select signal SEL, voltage VM at node 954, and voltages V2 and V3 at nodes 1155 and 1156, respectively. The operations of circuit 1105 are similar to those of circuit 905 except for the operations of the additional features of circuit 1105 mentioned herein.

Voltage VM of FIG. 11 is a variable voltage, such that it can have different values at different time intervals during a memory operation of IC device 1100. In contrast, voltage V1 of FIG. 9 is fixed at the same value during a memory operation of IC device 900.

Selector 1111 in FIG. 11 responds to signal SEL to select either voltage V2 or V3 and pass the selected voltage (V2 or V3) to node 954 as VM during a memory operation of IC device 1100. Selector 1111 of FIG. 11 can include a multiplexer with inputs to receive voltages V2 and V3 and an output to provide either voltage V2 or V3 to node 954 as voltage VM. Signal SEL has levels 1201 and 1202. Level 1201 occurs during time interval 1010 and during time portion 1022 of time interval 1020. Level 1202 occurs during time portion 1021 of time interval 1020. Alternatively, signal SEL can have level 1202 during at least a portion of time portion 1022 and it can go to level 1201 when signal WL switches to level 1081. Selector 1111 of FIG. 11 responds to signal SEL such that it can select voltage V3 and pass it to node 954 during time interval 1010 and select voltage V2 and pass it to node 954 during time portion 1021.

The value of voltage V3 can be greater than the value of voltage V2. For example, if the voltage representing the value of information stored in the memory is approximately $V_N$ plus a first offset value or minus a second offset value, then voltage V3 can be set to approximately $V_N$ and voltage V2 can be set to approximately $V_N$-$V_{LEAK}$. Voltage $V_{SUPPLY}$ is the supply voltage of IC device 1100. The first and second offset values are described above with reference to FIG. 9. Voltage $V_{LEAK}$ can be optimized and set as described above with reference to FIG. 9.

In IC device 1100 of FIG. 11, providing an extended or separate time interval (such as time portion 1021 in FIG. 12) for drawing the value of voltage on line 922 towards the value of voltage VM, enables IC device 1100 to have an improved effective equilibrating function similar to that of IC device 900 of FIG. 9. Further, in FIG. 11, providing different voltage values to node 954 during a memory operation, such as during time interval 1010 and time portion 1021, improves timing budget for a memory operation of IC device 1100, as explained below.

For example, in some cases, time interval 1010 is specified at a specific time value that may be too short to adequately or properly cause the values of the voltages on lines 921 and 922 to converge to an intended value (e.g., $V_N$-$V_{LEAK}$ or other intended values) at node 954 during an equilibrating function. Thus, in some cases, the values of the voltages on lines 921 and 922 may not have enough time to converge to the intended value at node 954 during an equilibrating function. However, by controlling a value of voltage VM at node 954 and extending the equilibrating time to include time portion 1021, the values of the voltages on lines 921 and 922 can be drawn to the intended value within the specific time for time interval 1010. Therefore, IC device 1100 can have a reduced timing budget for an effective equilibrating function. As a result, IC device can have an improved effective equilibrating function, a faster overall memory operation, or both. Further, by using VM set to V2 or V3, it can be tailored to make the equilibration convergent value less dependent on the duration of time interval 1010, resulting in more consistent sensing and performance. For example, if V3 is chosen as the natural voltage (e.g., $V_N$), then no shift is introduced to the convergent voltage during time interval 1010. Therefore, the equilibration convergent value is insensitive to changes the duration of time interval 1010. Time portion 1021 is not typically intentionally varied (e.g., by a user of IC device 1100). Thus, introducing a shift in VM during time portion 1021 is more acceptable for consistency purposes. This is similar to the alternative case mentioned earlier in the description with reference to FIG. 9.

Figure 13:
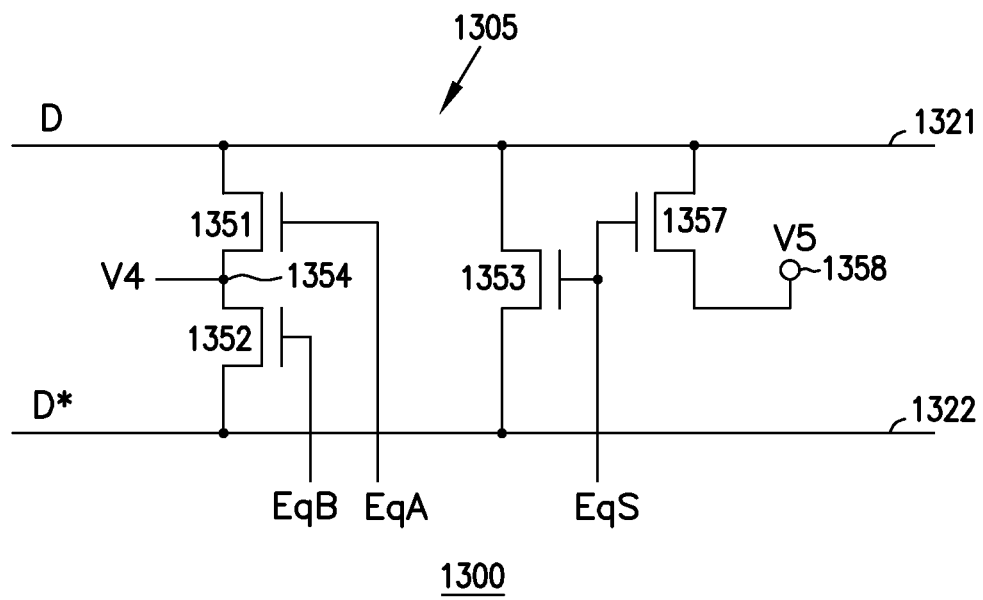
FIG. 13, FIG. 15, and FIG. 17 show partial diagrams of additional IC devices including circuits for use in an equilibrating function during memory operations of the additional IC devices, according to an embodiment of the invention.

FIG. 13 shows a partial diagram of an IC device 1300 including a circuit 1305 for use in an equilibrating function during a memory operation of IC device 1300, according to an embodiment of the invention. Circuit 1305 can be substituted for circuit 305 of FIG. 3. Thus, the combination of signals D and D* and lines 1321 and 1322 can correspond to the combination of signals D and D* and lines 321 and 322 of FIG. 3.

As shown in FIG. 13, circuit 1305 includes transistors 1351 and 1352 having gates responsive to signal EqA and EqB, and transistors 1353 and 1357 having gates responsive to signal EqS. Circuit 1305 equilibrates signals D and D* on lines 1321 and 1322 during a memory operation of IC device 900.

Figure 14:
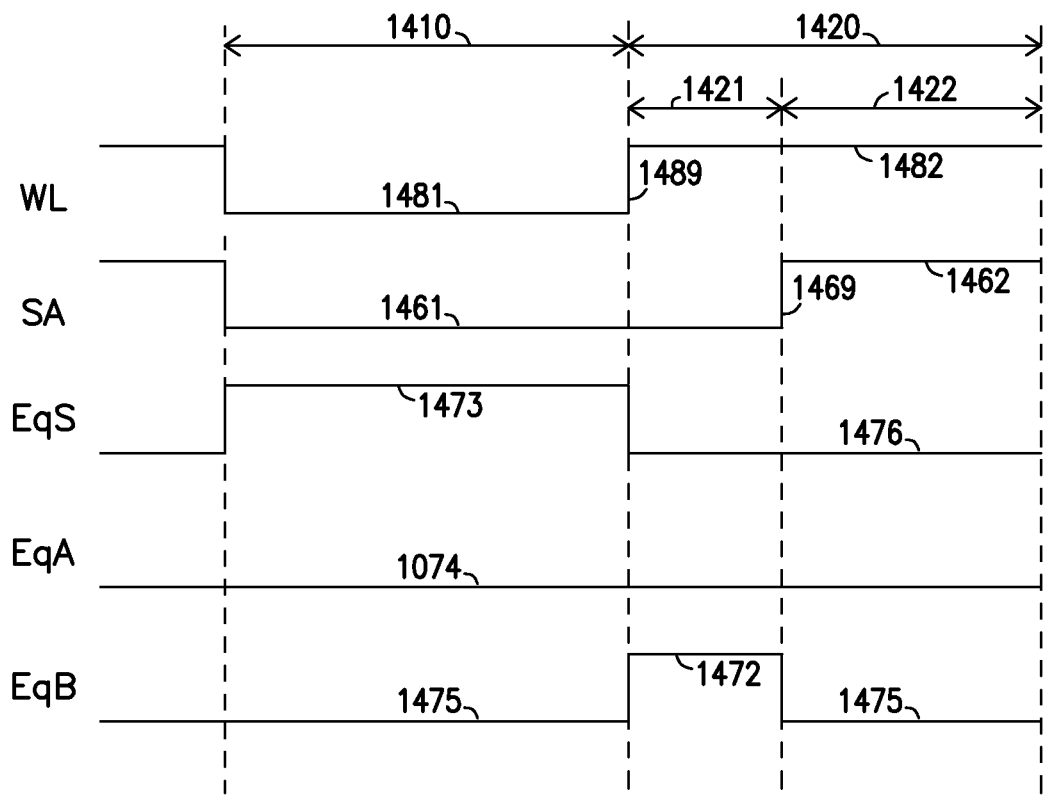
FIG. 14, FIG. 16, and FIG. 18 show example timing diagrams for the additional IC devices of FIG. 13, FIG. 15, and FIG. 17, respectively, during the memory operations of the additional IC devices, according to an embodiment of the invention.

FIG. 14 shows an example timing diagram during a memory operation of IC device 1300 of FIG. 13, according to an embodiment of the invention. FIG. 14 shows waveforms of signals EqA, EqB, and EqS of FIG. 13, and waveforms of signals WL and SA during time intervals 1410 and 1420 of a memory operation of IC device 1300. As shown in FIG. 14, time interval 1420 can be divided into time portions 1421 and 1422. Signal WL of FIG. 14 can be similar to signal WL1 or WL2 of FIG. 5. Signal SA of FIG. 14 can be similar to signal SA1 of FIG. 7 and FIG. 8.

IC device 1300 of FIG. 13 includes memory cells (not shown) associated with lines 1321 and 1322. Those memory cells can be similar to memory cells 301 and 302 of FIG. 3. In FIG. 14, signal WL represents the signal associated with a selected memory cell of IC device 1300. The selected memory can be similar to memory cell 501 or 502 of FIG. 5. Signal WL of FIG. 14 can correspond to signal WL1 of FIG. 5 if the selected memory cell of IC device 1300 corresponds to memory cell 501 of FIG. 5. Signal WL of FIG. 14 can also correspond to signal WL2 of FIG. 5 if the selected memory cell of IC device 1300 corresponds to memory cell 502 of FIG. 5. IC device 1300 uses signal WL to access the selected memory cell during a memory operation, such as a read or write operation.

In the following description with reference to FIG. 13 through FIG. 18, line 1321 is assumed to be associated with a selected memory cell (e.g., which can correspond to memory cell 1301 of FIG. 5) during a memory operation. Line 1322 is assumed to be associated with an unselected memory cell (which can correspond to memory cell 1302 of FIG. 5) during the memory operation.

IC device 1300 of FIG. 13 includes a sense circuit (not shown) that can be similar to circuit 307 of FIG. 3 or circuit 707 of FIG. 7. IC device 1300 uses signal SA of FIG. 14 to enable the sense circuit of IC device 1300 to sense signals D and D* on lines 1321 and 1322 during a memory operation to determine value of information transferred to or from the selected memory cell. The following description refers to both FIG. 13 and FIG. 14.

During a memory operation, IC device 1300 activate signal WL, such that it has signal levels 1481 and 1482 and a transition 1489. IC device 1300 accesses a selected memory cell associated with signal WL during time portion 1421 and senses signals D and D* (e.g., using a sense circuit) during time portion 1422. Circuit 1305 of IC device 1300 equilibrates signals D and D* during time interval 1410 and during time portion 1421 in response to signals EqA, EqB, and EqS.

As shown in time interval 1410 in FIG. 14, signal EqS is activated to signal level 1473 to turn on transistors 1353 and 1357 of FIG. 13. When transistors 1353 and 1357 are turned on, a conductive path is formed among circuit node 1358 and lines 1321 and 1322 of FIG. 13 through transistors 1353 and 1357. A charge sharing between lines 1321 and 1322 occurs when the conductive path is formed. Node 1358 has a voltage V5. The voltages on lines 1321 and 1322 converge to a value of the voltage at node 1358 (voltage V5) through transistors 1353 and 1357.

Signal EqA has a level 1474 (similar to level 1074 of FIG. 10) during both time intervals 1410 and 1420, such that transistor 1351 of FIG. 13 is turned off during these time intervals.

Signal EqB has level 1475 during time interval 1410, such that transistor 1352 of FIG. 13 is turned off during time interval 1410.

During time interval 1420, IC device 1300 of FIG. 13 switches signals EqS to level 1476 to turn off transistors 1353 and 1357. When transistors 1353 and 1357 are turned off, the path among node 1358 and lines 1321 and 1322 is disabled, meaning that lines 1321 and 1322 are electrically decoupled from node 1358.

During time portion 1421, IC device 1300 starts to access the selected memory cell to transfer information the selected memory cell and line 1321. Also during time portion 1421, IC device 1300 switches signal EqB to level 1472 to turn on transistor 1352. When transistor 1352 is turned on, a conductive path is formed between circuit node 1354 and line 1322 through transistor 1352. Thus, during time portion 1421, the value of the voltage on line 1322 is further drawn toward the value of voltage V4 at node 1354.

During time portion 1422, IC device 1300 switches signal EqB to level 1475 to electrically decouple line 1322 from node 1354 of FIG. 13. Then, IC device 1300 switches signal SA from level 1461 to level 1462 at transition 1469 to perform a sensing function to sense signals D and D* on lines 1321 and 1322 to determine value of information transferred to or from the selected memory cell.

The value of voltage V5 can be greater than the value of voltage V4. For example, if the voltage representing the value of information stored in the memory is approximately $V_N$ plus a first offset value or minus a second offset value, then voltage V5 can be set to approximately $V_N$ and voltage V4 can be set to approximately $V_N - V_{LEAK}$. Voltage $V_{SUPPLY}$ is the supply voltage of IC device 1100. Voltage $V_{LEAK}$, the first offset value, and second offset values are described above with reference to FIG. 9.

In IC device 1300 of FIG. 13, providing an extended or separate time interval (such as time portion 1421 in FIG. 14) for drawing the value of voltage on line 1322 towards the value of voltage V4, enables IC device 1300 to have an improved effective equilibrating function similar to that of IC device 1100 of FIG. 11. Further, in IC device 1300 of FIG. 13, different values for the voltages at nodes 1358 and 1354 during time interval 1410 and time portion 1421 have an effect similar to that of voltages V2 and V3 in IC device 1100 of FIG. 11. Thus, IC device 1300 has an improved timing budget for a memory operation of IC device 1300, similar to the improved timing budget of IC device 1100 of FIG. 11.

Figure 15:
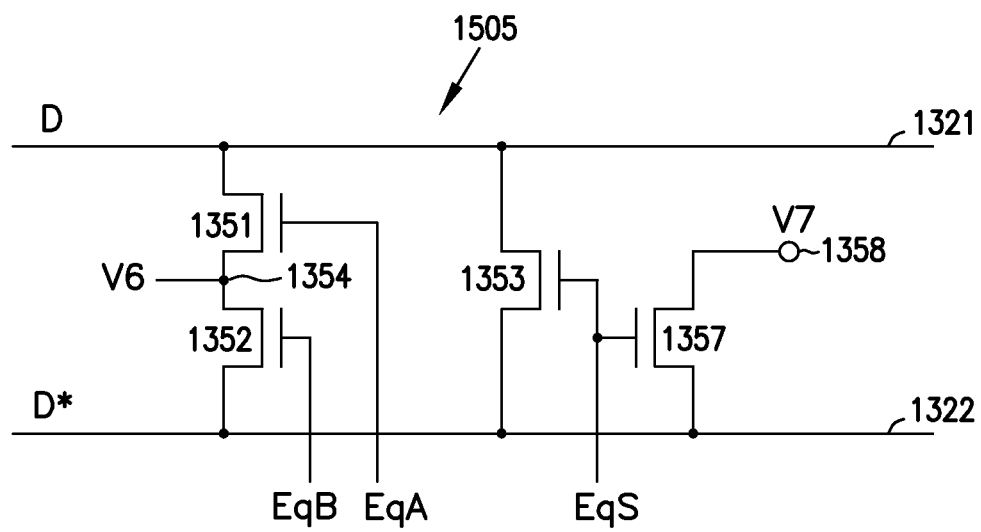
Figure 16:
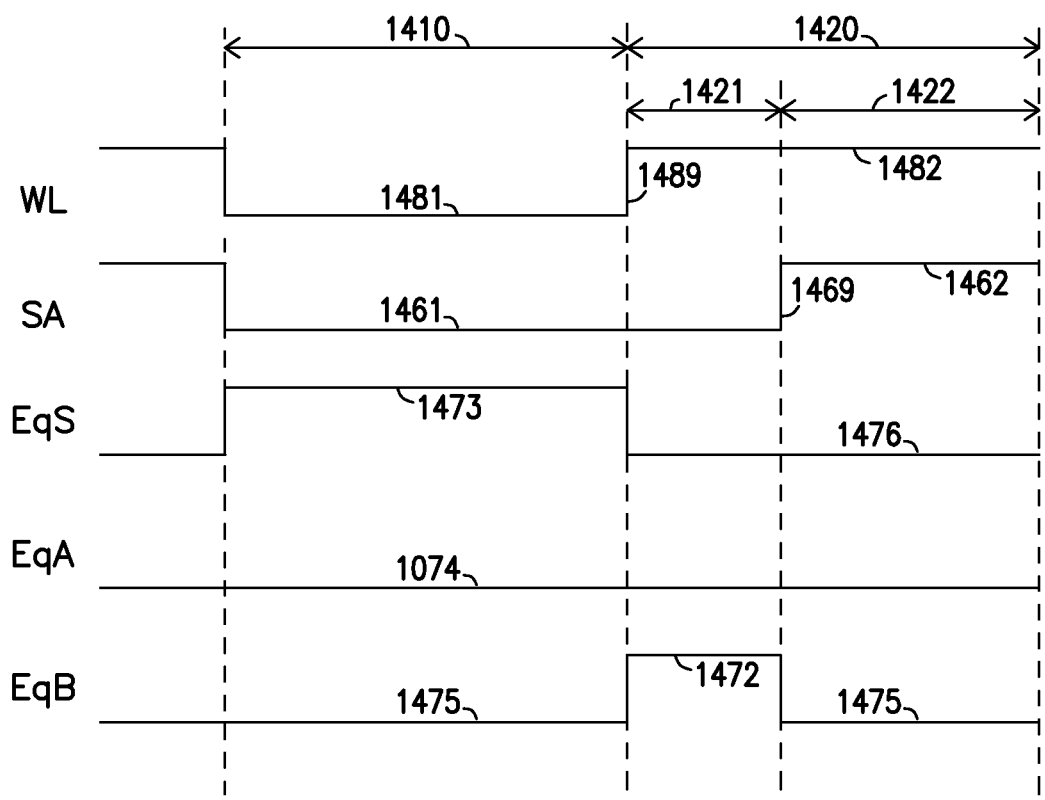

FIG. 15 shows a partial diagram of an IC device 1500 including a circuit 1505 for use in an equilibrating function during a memory operation of IC device 1500, according to an embodiment of the invention. FIG. 16 shows an example timing diagram during a memory operation of IC device 1500 of FIG. 15, according to an embodiment of the invention. Circuit 1505 of FIG. 15 and circuit 1305 of FIG. 13 include similar features. FIG. 14 and FIG. 16 also show waveforms associated with the similar features. Thus, for simplicity, the similar features between FIG. 13 and FIG. 15 and between FIG. 14 and FIG. 16 are given the same reference designations, such as transistors 1351, 1352, 1353, 1357, lines 1321 and 1322, signals D, D*, EqA, EqB, and signals WL and SA. For simplicity, the operations of these similar features are not repeated in the description of FIG. 15 and FIG. 16.

The difference between IC device 1500 of FIG. 15 and IC device 1300 of FIG. 13 is the connection of transistor 1357. In IC device 1300 of FIG. 13, transistor 1357 is coupled between line 1321 and node 1358. In IC device 1500 of FIG. 15 transistor 1357 of IC device 1500 is coupled between line 1322 (instead of line 1321) and node 1358. Thus, in IC device 1500, line 1322 (instead of line 1321) is electrically coupled to node 1358 when signal EqS has level 1473 during time interval 1410 of FIG. 16. Voltages V6 and V7 of IC device 1500 of FIG. 15 can have values similar to those of voltages V4 and V5, respectively, of IC device 1300 of FIG. 13. IC device 1500 of FIG. 15 can have improved equilibrating function and timing budget similar to those of IC device 1300 of FIG. 13.

Figure 17:
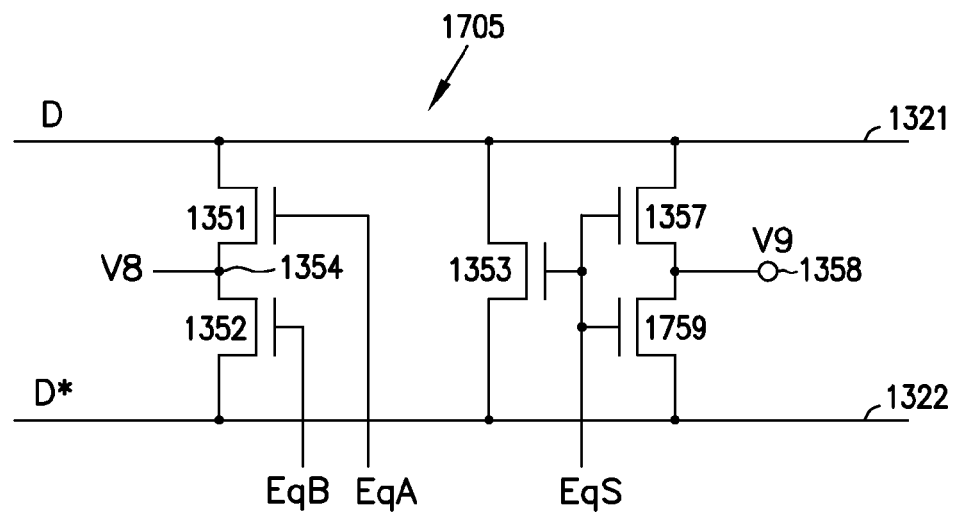
Figure 18:
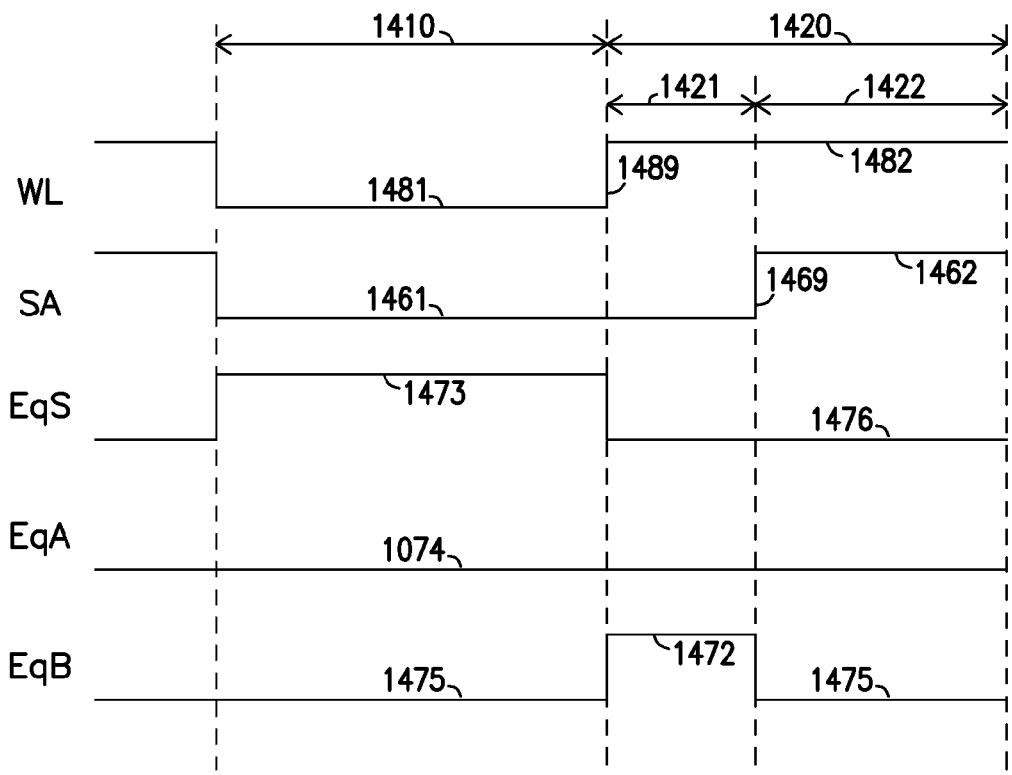

FIG. 17 shows a partial diagram of an IC device 1700 including a circuit 1705 for use in an equilibrating function during a memory operation of IC device 1700, according to an embodiment of the invention. FIG. 18 shows an example timing diagram during a memory operation of IC device 1700 of FIG. 17, according to an embodiment of the invention. Circuit 1705 of FIG. 17 and circuit 1305 of FIG. 13 include similar features. FIG. 14 and FIG. 18 also show waveforms associated with the similar features. Thus, for simplicity, the similar features between FIG. 13 and FIG. 17 and between FIG. 14 and FIG. 18 are given the same reference designations, such as transistors 1351, 1352, 1353, 1357, lines 1321 and 1322, signals D, D*, EqA, EqB, and signals WL and SA. For simplicity, the operations of these similar features are not repeated in the description of FIG. 17 and FIG. 18.

The difference between IC device 1700 of FIG. 17 and IC device 1300 of FIG. 13 is the addition of transistor 1759 coupled between line 1322 and node 1358 of IC device 1700 of FIG. 17. Thus, in IC device 1700, both lines 1321 and 1322 are electrically coupled to node 1358 when signal EqS has level 1473 during time interval 1410 of FIG. 18. Voltages V8 and V9 of IC device 1700 of FIG. 17 can have values similar to those of voltages V4 and V5, respectively, of IC device 1300 of FIG. 13. IC device 1700 of FIG. 17 can have improved equilibrating function and timing budget similar to those of IC device 1300 of FIG. 13.

Figure 19:
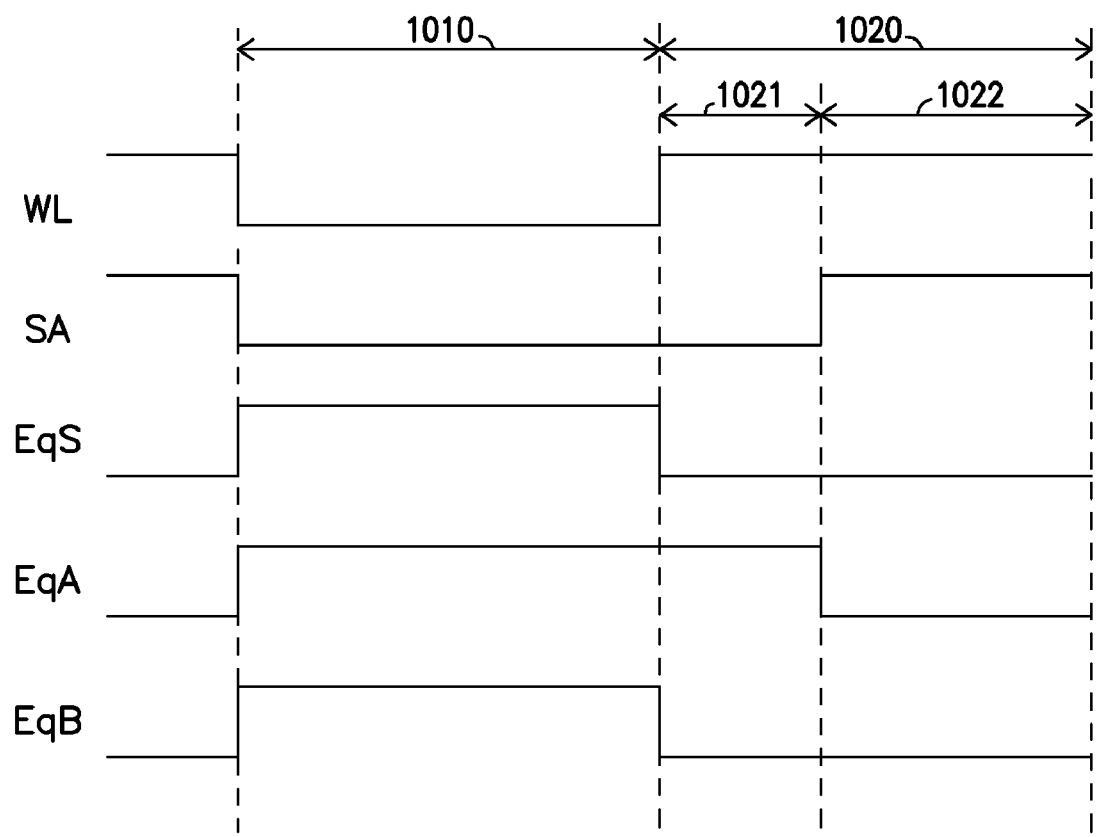
FIG. 19 and FIG. 20 show examples of alternative timing diagrams during memory operations of the IC devices of FIG. 9 through FIG. 18, according to an embodiment of the invention.
Figure 20:
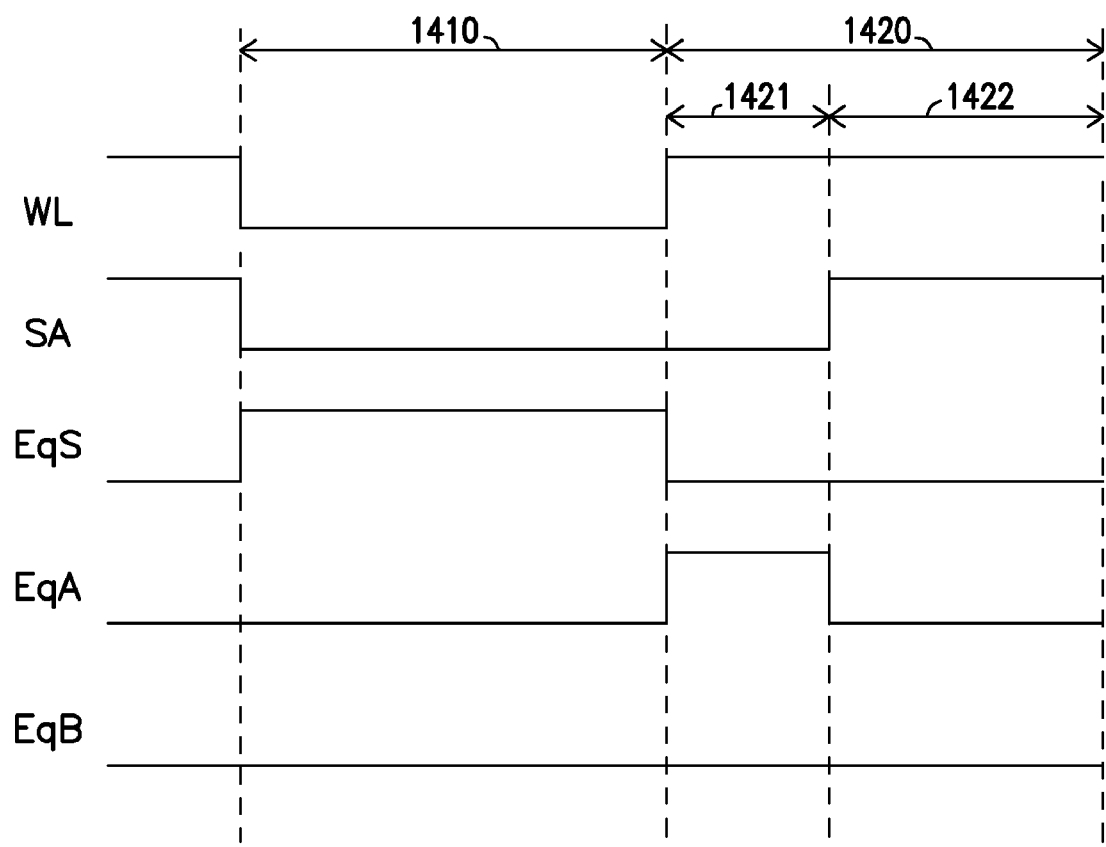

FIG. 19 and FIG. 20 show examples of alternative timing diagrams during memory operations of the IC devices described above with reference to FIG. 9 through FIG. 18, according to an embodiment of the invention.

In the above description with reference to FIG. 9 through FIG. 12, line 921 is assumed to be associated with a selected memory, so that information can be transferred to or from the selected memory cell through line 921 during a memory operation. Line 922 is assumed to be connected to an unselected memory cell during the memory operation. Thus, as described above with reference to FIG. 9 through FIG. 12, signal WL in FIG. 10 and FIG. 12 can correspond to signal WL1 of FIG. 5 because the selected memory cell of IC device 900 of FIG. 9 and IC device 1100 of FIG. 11 corresponds to memory cell 501 of FIG. 5.

However, in another case, line 922 (instead of line 921) can be associated with a selected memory, so that information can be transferred to or from the selected memory cell through line 922 during a memory operation while line 921 can be associated with an unselected memory cell in the memory operation. Thus, in this case, signal WL in FIG. 19 can correspond to signal WL2 of FIG. 5, and the waveforms of signals EqA and EqB are swapped in comparison to the signals EqA and EqB in FIG. 10 and FIG. 12.

Similarly, in the above description with reference to FIG. 13 through FIG. 18, lines 1321 and 1322 are assumed to be associated with a selected memory cell and unselected memory, respectively, in a memory operation. However, in another case, line 1322 can be associated with a selected memory in a memory operation while line 1321 can be associated with an unselected memory cell in the memory operation. In this case, the waveforms of signals EqA and EqB in FIG. 20 are swapped in comparison to signals EqA and EqB of FIGS. 14, 16, and 18.

One or more embodiments described herein include apparatus and methods having a memory cell included in a device, a control line configured to receive a control signal to access the memory cell, and a first line configured to transfer information to and from the memory cell. The control signal has a first level during a first time interval and a second level during a second time interval of a memory operation. The apparatus and methods also include equilibration and sense amplifier circuits configured to reduce difference between a value of a voltage on the second line and a value of a voltage on a node of the device during a first time portion of the second time interval. Other embodiments, including additional methods and devices, are described above with reference to FIG. 1 through FIG. 20.

The illustrations of apparatus such as IC devices 100, 200, 300, 500, 700, 900, 1100, 1300, 1500, and 1700 are intended to provide a general understanding of the structure of various embodiments and not a complete description of all the elements and features of the apparatus that might make use of the structures described herein.

Any of the components described above can be implemented in a number of ways, including simulation via software. Thus, apparatus (e.g., IC device 100, 200, 300, 500, 700, 900, 1100, 1300, 1500, and 1700 and their associated components described above can all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., IC device 100, 200, 300, 500, 700, 900, 1100, 1300, 1500, and 1700), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multichip modules. Such apparatus may further be included as sub-components within a variety of electronic systems, such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
a memory cell;
a first line coupled to the memory cell; and
an equilibrating circuit including a first transistor and a second transistor coupled between the first line and a second line, the first transistor including a gate to receive a first signal, the second transistor including a gate to receive a second signal, wherein the first and second signals include different levels, wherein the equilibrating circuit is configured to switch the second signal from a first level during a first time interval of an operation to a second level during first time portion of a second time interval of the operation, and the equilibrating circuit is configured to switch the second signal from the second level during the first time portion of the second time interval to a third level during a second time portion of the second time interval.

2. The apparatus of claim 1, wherein the equilibrating circuit includes a third transistor coupled in parallel with the first and second transistors between the first and second lines.

3. The apparatus of claim 2, wherein the equilibrating circuit includes a fourth transistor coupled between the first line and a circuit node.

4. The apparatus of claim 3, wherein the third transistor includes a gate coupled to a gate of the fourth transistor.

5. The apparatus of claim 3, wherein the equilibrating circuit includes a fifth transistor coupled between the second line and the circuit node.

6. The apparatus of claim 5, wherein the third transistor includes a gate coupled to a gate of the fourth transistor and to a gate of the fifth transistor.

7. An apparatus comprising:
a memory cell;
a first line to transfer information from the memory cell;
a first transistor and a second transistor coupled in series between the first line and a second line; and
a module configured to provide a first signal to a gate of the first transistor during a first time interval a second time interval, and to cause a second signal at a gate of the second transistor to switch from a first level during the first time interval to a second level during a first time portion of the second time interval, and the module is configured to cause the second signal to switch from the second level during the first time portion of the second time interval to a third level during a second time portion of the second time interval.

8. The apparatus of claim 7, further comprising a sense amplifier coupled to the first and second lines.

9. The apparatus of claim 7, further comprising an equilibrating circuit coupled to the first and second lines, wherein the equilibrating circuit includes the first and second transistors.

10. The apparatus of claim 7, further comprising a third transistor coupled in parallel with the first and second transistors between the first and second lines.

11. The apparatus of claim 7, wherein the first and second transistors have a same type.

12. The apparatus of claim 7, further comprising a control line to access the memory cell, wherein the module is configured to switch a control signal at the control line from a fifth level during the first time interval to a sixth level during the second time interval.

13. The apparatus of claim 7, wherein the first level is lower than the second level, and the first level is equal to the third level.

14. The apparatus of claim 12, wherein the fifth level is lower than the sixth level.

15. An apparatus comprising:
a memory cell;
a first line to transfer information from the memory cell;
a control line to access the memory cell, the control line to receive a control signal having a first level during a first time interval and a second level during a second time interval; and
a module configured to switch a signal at a gate of a transistor coupled between the first line and a circuit node from a first level during the first time interval to a second level during a first time portion of the second time interval, and to switch the signal from the second level during the first time portion of the second time interval to a third level during a second time portion of the second time interval.

16. The apparatus of claim 15, wherein the module is configured to form the first and second conductive segments during an equilibrating function of the apparatus.

17. The apparatus of claim 15, wherein the module is configured to form a conductive path between the first and second lines during the first time interval.

18. The apparatus of claim 15, wherein the module is configured sense signals on the first and second lines after the first time portion of the second time interval.

19. The apparatus of claim 15, wherein the circuit node is configured to provide a voltage.

20. The apparatus of claim 19, further comprising a selector to selectively couple the circuit node to another voltage different from the voltage provided at the circuit node.

* * * * *

UNITED STATES PATENT AND TRADEMARK OFFICE
CERTIFICATE OF CORRECTION

| | |
|---|---|
| PATENT NO. | : 8,379,469 B2 |
| APPLICATION NO. | : 13/361630 |
| DATED | : February 19, 2013 |
| INVENTOR(S) | : Brian W. Huber et al. |

It is certified that error appears in the above-identified patent and that said Letters Patent is hereby corrected as shown below:

In the Claims:

In column 16, line 14, in Claim 1, after "during" insert -- a --.

In column 16, line 40, in Claim 7, after "interval" insert -- and --.

In column 18, line 8, in Claim 18, after "configured" insert -- to --.

Signed and Sealed this
Seventh Day of May, 2013

Teresa Stanek Rea
*Acting Director of the United States Patent and Trademark Office*